(12) United States Patent
Harris et al.

(10) Patent No.: US 6,472,624 B1
(45) Date of Patent: Oct. 29, 2002

(54) IN-LINE FLOW SWITCH

(75) Inventors: Jaime Harris, Eagan; Gary Brown, Faribault; Joel Fisher, South St. Paul, all of MN (US)

(73) Assignee: GP Companies, Inc., Mendota Heights, MN (US)

( * ) Notice: Subject to any disclaimer, the term of this patent is extended or adjusted under 35 U.S.C. 154(b) by 0 days.

(21) Appl. No.: 09/669,661

(22) Filed: Sep. 26, 2000

(51) Int. Cl.[7] .............................................. H01H 35/40
(52) U.S. Cl. ......................... 200/81.9 R; 200/81.9 M; 200/82 E
(58) Field of Search .................... 200/81 R, 81.9 R, 200/81.9 M, 82 R, 82 E; 335/205–208

(56) References Cited

U.S. PATENT DOCUMENTS

| | | | |
|---|---|---|---|
| 2,963,563 A | | 12/1960 | Patterson .................. 200/81.9 |
| 4,166,936 A | * | 9/1979 | Tice ......................... 200/82 E |
| 4,181,835 A | | 1/1980 | Stadler et al. ............ 200/82 E |
| 4,213,021 A | | 7/1980 | Alexander ............ 200/81.9 M |
| 4,513,184 A | * | 4/1985 | Hughes ................ 200/81.9 M |
| 4,519,256 A | | 5/1985 | Daniels ....................... 73/745 |
| 4,793,188 A | * | 12/1988 | Strasser et al. ........... 200/82 E |
| 4,996,396 A | | 2/1991 | Smith .................. 200/81.9 M |
| 5,070,220 A | | 12/1991 | Glenn ................. 200/81.9 M |
| 5,126,722 A | | 6/1992 | Kamis ......................... 340/606 |
| 5,162,624 A | * | 11/1992 | Duksa .................. 200/81.9 M |
| 5,416,294 A | * | 5/1995 | Glenn .................. 200/81.9 M |
| 5,478,977 A | * | 12/1995 | Beasley .................... 200/82 E |
| 5,580,444 A | | 12/1996 | Burrows ....................... 210/85 |

* cited by examiner

Primary Examiner—J. R. Scott
(74) Attorney, Agent, or Firm—Steven C. Lieske; Oppenheimer Wolff & Donnelly LLP

(57) ABSTRACT

A flow switch for a high pressure washing system or other flow-related system is disclosed. The flow switch switches from an open to a closed position in the presence of adequate flow in a water or other fluid-carrying pipe. The flow switch includes a cartridge body, a sensor, a plunger, a magnet, and a spring. The cartridge body has an inlet port and an outlet port which allows fluid to flow into the cartridge body, through a flow chamber, and out of the cartridge body. The cartridge body also has a sensor chamber for accommodating the sensor. The sensor is positioned within the sensor chamber and is used to determine whether fluid is flowing through the flow chamber. A plunger is positioned within the flow chamber, and is responsive to fluid flow. Between the plunger and the sensor is a spring. The spring prevents the plunger from coming in close proximity to the sensor absent fluid flow. However, when there is fluid flow, the spring is compressed and the plunger comes in close proximity to the sensor and communicates with the sensor to allow the sensor to determine that fluid is flowing through the flow chamber. The flow switch can also include a housing, which accommodates the cartridge, sensor, plunger, and spring.

5 Claims, 4 Drawing Sheets

IN-LINE FLOW SWITCH

BACKGROUND OF THE INVENTION

The present invention generally relates to switches. In particular, the present invention relates to flow switches which are useful as a component of a high pressure washing system and other systems where the stoppage of flow could be used to trigger an action.

In high pressure washing systems, water is heated in water heater tanks by burners. The burners must be regulated so that the water does not become too hot, otherwise the water heater tanks can be in danger of exploding. One method of regulating the water heating subsystem of a high pressure washing system was by using a pressure switch. A pressure switch flips between its "off" and "on" positions depending on whether there is pressure present in the water pipe leading out of the water heater tank. When pressure was present, the pressure switch allowed the burners to operate. When pressure was removed, the pressure switch turned off the burners.

Regulating the burners with a flow switch rather than a pressure switch is another method that is used in the industry. A flow switch senses flow rather than pressure. Thus, while a customer is using the washing system, a flow switch can sense the flow of water through the system and can turn on the burners during this time. When the customer releases the trigger on the washer's wand, the water flow ceases and the flow switch can be used to turn the burner off.

Known flow switches in the high-pressure washing system industry are reed-type switches. In such a reed switch, a piston within a water pipe is spring loaded. While water is flowing through the pipe, the water pressure against the piston compresses the spring, causing the piston to be located at a certain position within the pipe. Once the water pressure is relieved, the piston is no longer pressed against the spring, and so the spring decompresses, moving the piston back to its resting position. The piston within the pipe is fitted with a magnet. The reed switch sensor is installed exterior to the water pipe, parallel to the piston's axis of movement. The metal reed switch sensor opens or closes depending on the piston's position within the pipe.

Such reed switches have their disadvantages. Foremost, to protect the switch, the reed switch is placed in a sealed glass capsule-like container. Glass is needed because of its magnetically neutral properties. The glass container may be housed in a thin brass sleeve for attachment to the water pipe. Of course, the glass container is prone to breakage. In fact, the glass container is sometimes damaged even during shipping. If shipping doesn't break the glass container, installing the switch can break it. Often, the reed switch within the glass container is installed to the brass sleeve or water pipe with a set screw. If this set screw is overly tightened, the glass container breaks. Even after installation, a reed switch remains prone to breakage from undue vibrations in the water pipe or by carelessness of maintenance workers when working near the switch.

Another disadvantage of the reed switches is the calibration needed during installation. The reed switch within its glass container opens and closes based on a magnetic field from the magnet on the piston within the water pipe. On installation, the reed switch must be positioned very precisely so that the switch will open and close properly. If the switch is not calibrated correctly against the piston's magnet, the switch will not be able to correctly sense the flow of water through the pipe. Each time the reed switch is replaced, this calibration must be repeated.

A final disadvantage to some of the current flow switches is the pressure drop associated with using the switch. Some current switches can cause a pressure drop of between 30 and 45 p.s.i. when the flow rate is at 7 gallons per minute. This pressure drop is an inefficiency that makes a washing system utilizing such switches less desirable.

It would be desirable to manufacture a switch that alleviates the disadvantages of the current flow switches. It would be desirable to have such a switch not encased in glass or other fragile material so that the switch could be quite dependable and rugged. It would also be desirable to have the switch capable of being installed easily, with fewer calibration issues. Finally, the switch should cause minimal pressure drop.

SUMMARY OF THE INVENTION

The present invention is a in-line flow switch for a high-pressure washing system or other flow-related system. The in-line flow switch is normally in the open position, but is moved to the closed position by the flow of water or other fluid through a pipe.

The in-line flow switch includes a housing and a cartridge. The cartridge is made up of a plunger retainer, a plunger, an actuator magnet, a spring, a face seal washer, a sensor, and a cartridge body.

The in-line flow switch advantageously is made up of inexpensive, durable materials, without the need for a reed switch's use of glass. All of the moving parts to the in-line flow switch are packaged in a single cartridge which is advantageous for maintenance; if the in-line flow switch should fail, the entire switch can be quickly and easily replaced by disconnecting the faulty in-line flow switch cartridge and replacing it with a new in-line flow switch cartridge. Another advantage of the present invention is that when the in-line flow switch is installed, the calibration procedure needed with prior reed switches is eliminated.

DETAILED DESCRIPTION OF THE INVENTION

The present invention is a in-line flow switch for a high-pressure washing system or other flow-related system. Throughout the drawings, an attempt has been made to label corresponding elements with the same element numbers. The element numbers include:

| | |
|---|---|
| 1 | housing |
| 2 | plunger retainer |
| 3 | plunger |
| 4 | actuator magnet |

-continued

| | |
|---|---|
| 5 | spring |
| 6 | face seal washer |
| 7 | cartridge body |
| 8 | sensor |
| 10 | cartridge |
| 11 | housing inlet port |
| 12 | housing outlet port |
| 13 | cartridge-receiving port |
| 14 | front end |
| 15 | back end |
| 16 | flow chamber |
| 17 | inlet port |
| 18 | outlet port |
| 19 | sensor chamber |
| 20 | sensor entrance |
| 21 | chamber divider |

Figure 1A:
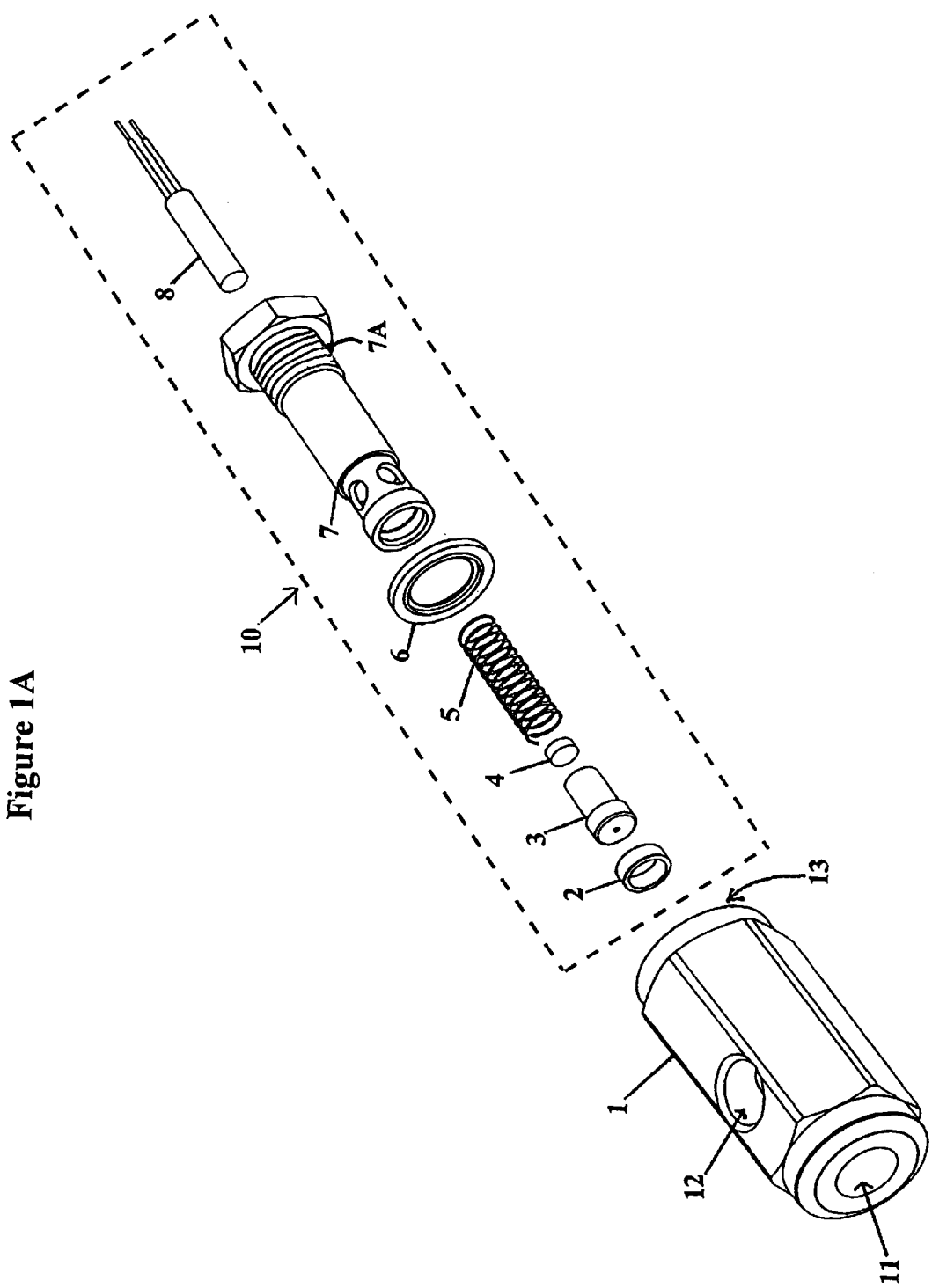
FIG. 1A is an exploded diagram of the in-line flow switch, showing the housing and the bly.

Refering to the drawings, FIG. 1A shows an exploded view of the in-line flow switch. The in-line flow switch consists of a housing 1 and a cartridge 10 which fits within the housing 1. Cartridge 10 is made up of a cartridge body 7, into which a sensor 8 is fitted. The cartridge Body 7 also has a face seal washer 6, spring 5, an actuator magnet 4, a plunger 3, and a plunger retainer 2.

Housing 1 has a housing inlet port 11, a housing outlet port 12, and a cartridge-receiving port 13. In one embodiment, housing 1 is constructed from brass, specifically, brass C360per ASTMB-16. The housing inlet port 11 is configured as with threads for receiving a ⅜ inch pipe. Of course other dimensions and fabrications for housing I can also be used.

Figure 3A:
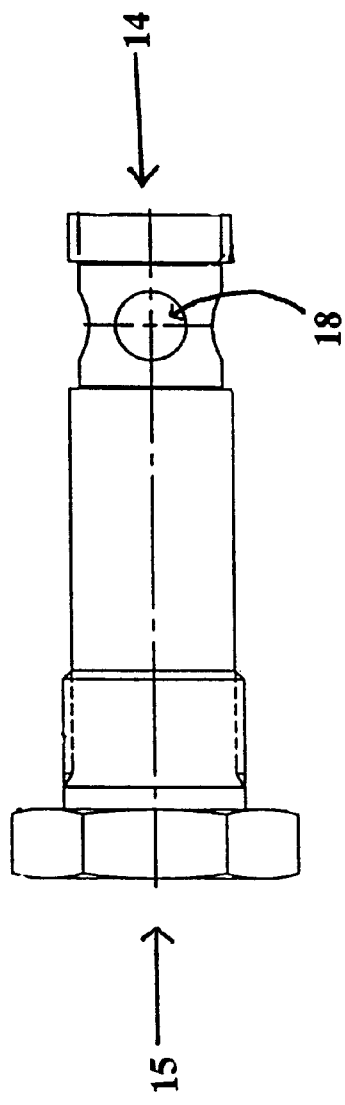
FIG. 3A is a side plan view of the cartridge body.
Figure 3B:
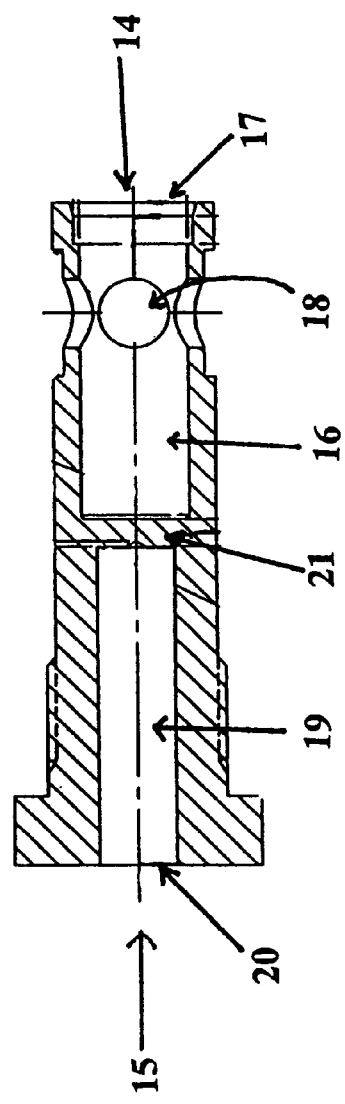
FIG. 3B is a cross-sectional view of the cartridge body.

FIGS. 3A and 3B show cartridge body 7 in more detail. Cartridge body has a front end 14 and a back end 15. A flow chamber 16 is positioned longitudinally within the cartridge body 7 from the front end 14. The flow chamber 16 has an inlet port 17 along the front end 14 one outlet port 18, for allowing fluid to flow into the cartridge body 7 from the inlet rough the flow chamber 16 and exiting the cartridge body 7 from the outlet port 18. A sensor chamber 19 is positioned longitudinally within the cartridge body 7 from the back end 15, sensor entrance 20 to allow the sensor 8 to be fitted. A chamber divider 21 separates amber 16 and the sensor chamber 19.

Sensor 8 can be placed in the sensor chamber 19 and affixed with adhesive, using enough adhesive to fill in space behind sensor 8. The adhesive used could be one of several types, including Loctite Toughened Instant Adhesive, an acrylic adhesive manufactured by Loctite. In one preferred embodiment, cartridge body 7 is constructed from brass (C360 per ASTM B-16). Of course other embodiments, of differing configurations and materials can also be made.

Referring again to FIG. 1, plunger 3 includes a magnet recess which is shaped to accept actuator magnet 4. The actuator magnet 4 must have enough energy to activate the sensor 8 through the chamber divider 21. The actuator magnet 4 may be made of nickel plated neodymium. Plunger 3 in this configuration is formed from acetyl, but could be made from a metal or other plastic material.

Plunger 3 and actuator magnet 4 are placed against the spring 5 in cartridge body 10. In one preferred embodiment, spring 5 is made from stainless steel wire. The spring design is critical as the spring 5 must be weak enough to compress allowing flow past the plunger 3, to meet the minimum flow requirements. The spring 5 also must be strong enough to overcome the magnetic attraction between the actuator magnet 4 and the sensor 8 when flow stops.

Plunger 3 and actuator magnet 4 are held within cartridge body 10 by means of plunger retainer 2. In one preferred embodiment, plunger retainer 2 is made from brass (per ASTM B-16). The final piece to the cartridge 10 is the face seal washer 6, which fits over the cartridge body 7 to seal the cartridge 10 to the housing 1. In one preferred embodiment, face seal washer 6 is made from yellow zinc plated carbon steel with a rubber insert, having a minimum burst pressure of 18,000 p.s.i. Other sealing configurations could be utilized such as a gasket or an o-ring. The mating parts would have to be redesigned to use these types of seals, but they are commonly available in the industry.

The in-line flow switch is created by attaching the sensor 8 to cartridge body 7 using adhesive as previously described. The actuator magnet 4 is secured in the magnet recess of plunger 3 with an adhesive, such as Scotch-Weld brand structural plastic adhesive, an acrylic adhesive manufactured by 3M. Once the adhesive has cured, the in-line flow switch can be fully assembled. Plunger 3 with the attached actuator magnet 4, and spring 5 are inserted within the cartridge body 7. The plunger retainer 2 is pressed in place to secure the plunger 3, magnet 4 and spring 5. The plunger retainer 2 could also be threaded. Then the cartridge body 7 is inserted through the face seal washer 6 and the entire assembly is inserted into housing 1. To install the in-line flow switch, water lines are attached to the housing inlet port 11 and housing outlet port 12.

In operation, as long as there is water flowing through the in-line flow switch, plunger 3 will compress spring 5 so that actuator magnet 4 will be close enough in proximity to sensor 8 to close sensor's circuit. In the preferred embodiment, flows less than 0.5 gallons per minute will cause the switch to be closed. When water is not flowing through the switch, spring 5 decompresses, moving actuator magnet 4 far enough away from sensor 8 so that sensor's circuit opens.

Figure 2A:
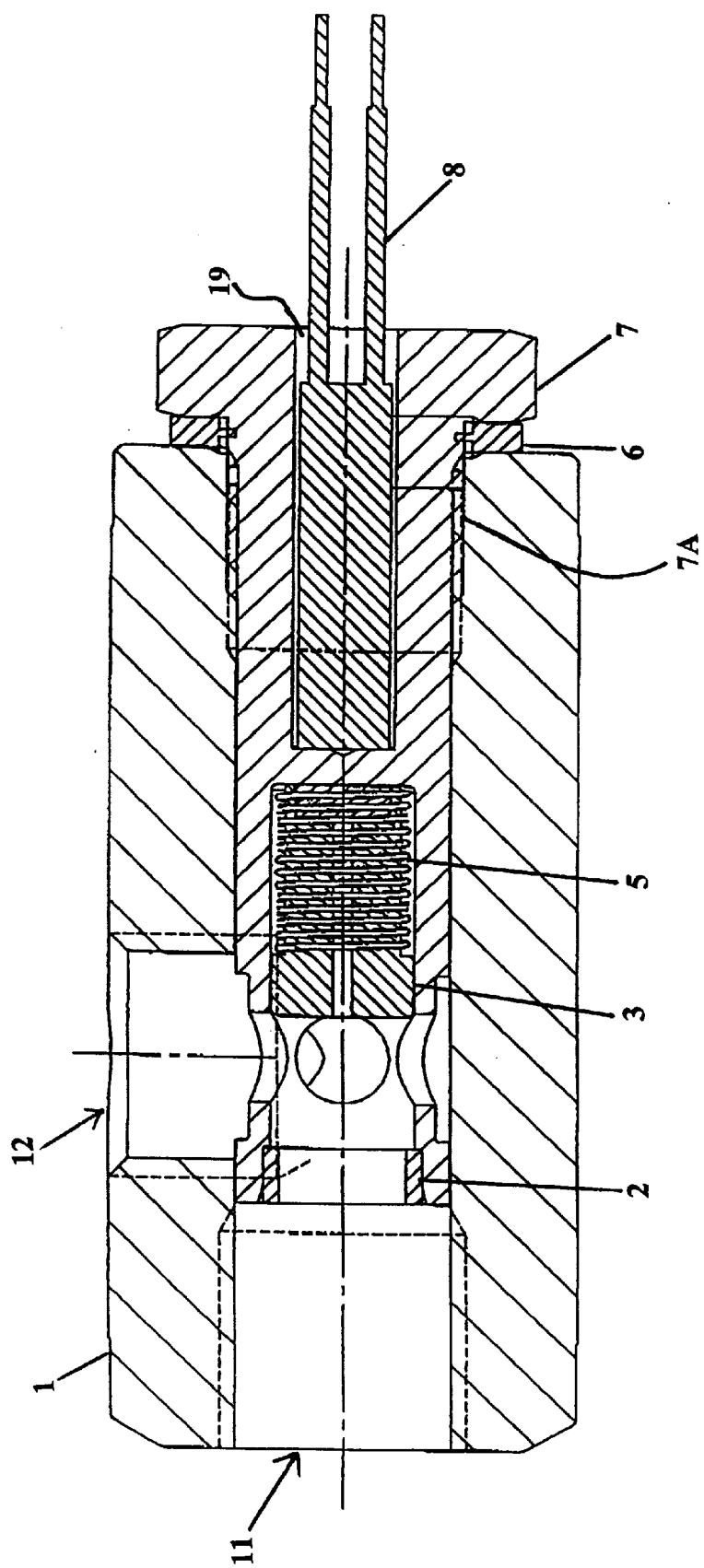
FIG. 2A is a cross-sectional view of the in-line flow switch showing how the plunger compresses spring and moves actuator magnet proximately close to the sensor when fluid flow is present.
Figure 2B:
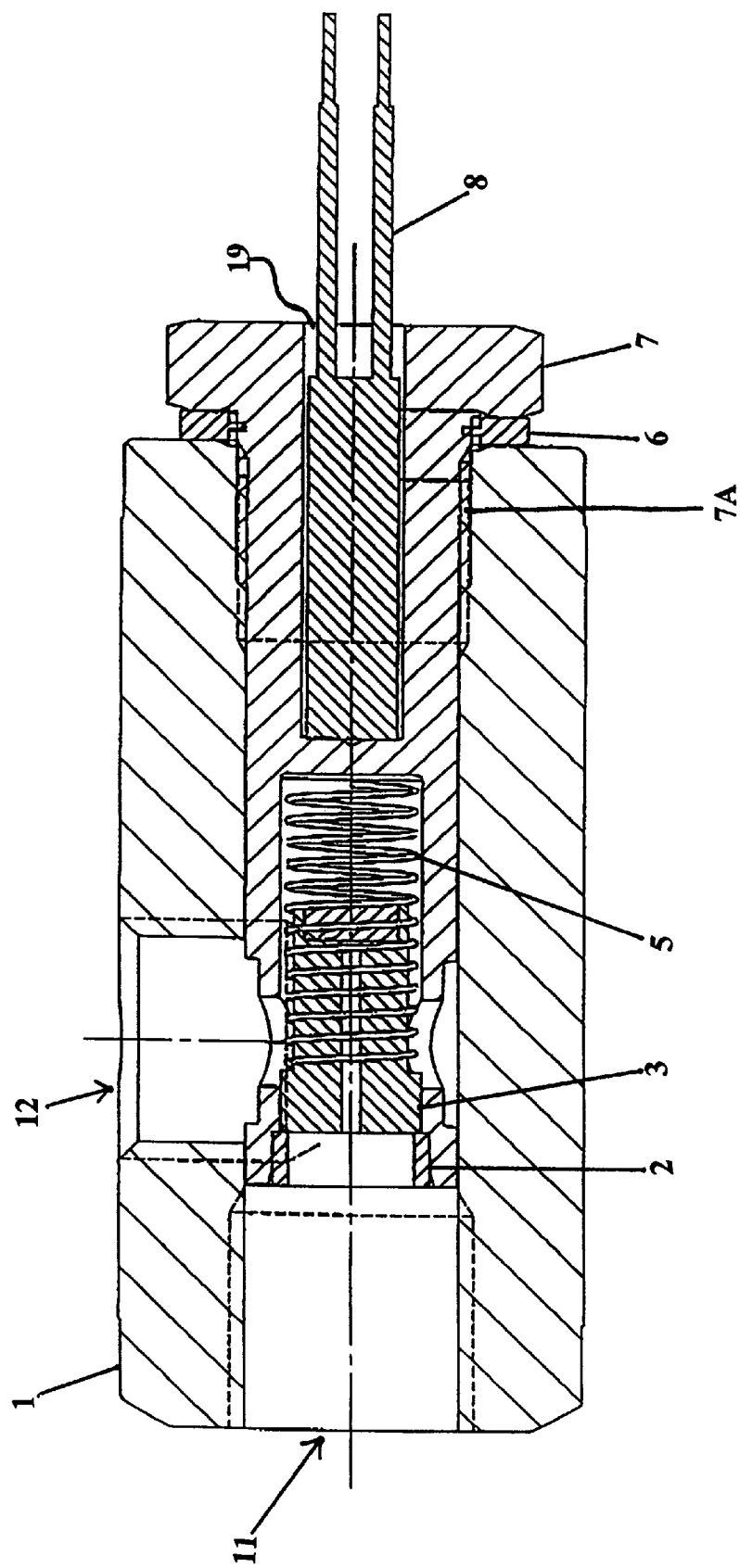
FIG. 2B is a cross-sectional view of the in-line flow switching showing the plunger not compressing the spring due to an absence of fluid flow.

FIG. 2A is a cross-sectional view of the in-line flow switch. FIG. 2A illustrates the in-line flow switch when fluid is flowing from the housing inlet port 11, through the flow chamber 16 and out the housing outlet port. The fluid flow has forced plunger 3 to compress spring 5, which allows the actuator magnet 4 to come in close proximity to sensor 8. FIG. 2B is also a cross-sectional view of the in-line flow switch. However, in FIG. 2B, there is no fluid flow through the switch. Thus, plunger 3 is no longer compressing spring 5 and actuator magnet 4 is not in close proximity to sensor 8.

The advantages to the present invention include its durability, ease of maintenance, high pressure rating, and minimal pressure drop. The present invention is more durable than the reed switches currently used in the high-pressure washing system industry because this type of switch does not require a glass container. Instead, the switch is made from brass and other durable, yet economical, products. The present invention provides ease of maintenance because should a component fail, all of the moving pieces can be replaced as a single cartridge. The faulty cartridge is simply unscrewed from the housing 1 and a new replacement cartridge is screwed in. Unlike repairing a reed type switch, installation of a replacement cartridge in the present invention does not require any calibration. The present invention is rated at up to 5,000 p.s.i., which is quite higher than most other switches currently on the market. The present invention operates efficiently causing a minimal pressure drop in flows from 0.5 gallons per minute to 12.0 gallons per minute. The flow passageways, magnet 4 and sensor 8 can be changed to encompass different flows.

Although the present invention has been described with reference to the preferred embodiments, workers skilled in the art will recognize that changes may be made in form and detail without departing from the spirit and scope of the invention.

What is claimed is:

1. A flow switch cartridge that is replacably mountable within a housing, comprising:

a cartridge body having:
      a flow chamber, positioned within the cartridge body at a front end thereof, the flow chamber having an inlet port along the front end and at least one outlet port for allowing fluid to flow into the cartridge body from -the inlet port through the flow chamber and exiting the cartridge body from the outlet port; and
      a sensor chamber, positioned within the cartridge body at a back end thereof and within the same axis -as the flow chamber, for accommodating a sensor;
   a plunger positioned within the flow chamber, the plunger positionally responsive to fluid flow and in communication with the sensor when in close proximity to the sensor;
   a spring cooperating with the plunger, for biasing the plunger to a first position when no flow is present, and allowing the plunger to move to a second position when flow is present;
   a sensor, positioned in the sensor chamber, for determining whether fluid is flowing through the flow chamber based on the plunger position; and
   a housing, the housing comprising:
      a housing inlet port, for connecting the housing to a fluid pipe;
      a housing outlet port, for connecting the housing to a fluid pipe; and
      a cartridge-receiving port, for accommodating the cartridge body so that fluid can flow in a path by flowing into the housing from the housing inlet port, into the inlet port of the flow chamber, against the plunger within the flow chamber, out the outlet port of the flow chamber, and exiting the housing from the housing outlet port.

2. The flow switch cartridge of claim 1, further comprising a seal formed to fit over the cartridge body for sealing the cartridge body to the housing in a generally watertight manner.

3. A flow switch, comprising:

a cartridge, comprising:
      a cartridge body having:
         a flow chamber, positioned within the cartridge body at a front end thereof, the flow chamber having an inlet port along the front end and at least one outlet port for allowing fluid to flow into the cartridge body from the inlet port through the flow chamber and exiting the cartridge body from the outlet port; and
         a sensor chamber, positioned within the cartridge body at a back end thereof, for accommodating a sensor;
      a plunger positioned within the flow chamber, the plunger positionally responsive to fluid flow and in communication with the sensor when in close proximity to the sensor;
      a spring cooperating with the plunger, for biasing the plunger to a first position when no flow is present, and allowing the plunger to move to a second position when flow is present; and
      a sensor, positioned in the sensor chamber, for determining whether fluid is flowing through the flow chamber by the plunger position;
   a housing, the housing comprising:
      a housing inlet port, for connecting the housing to a fluid pipe;
      a housing outlet port, for connecting the housing to a fluid pipe; and
      a cartridge-receiving port, for accommodating the cartridge body so that fluid can flow in a path by flowing into the housing from the housing inlet port, into the inlet port of the flow chamber, against the plunger within the flow chamber, out the outlet port of the flow chamber, and exiting the housing from the housing outlet port; and
   a seal formed to fit over the cartridge body for sealing the cartridge body to the housing in a generally watertight manner.

4. The flow switch of claim 3, further comprising an actuator magnet secured to the plunger, for magnetically communicating with the sensor.

5. The flow switch of claim 3, wherein the sensor produces a first signal when plunger is in the first position and a second signal when the plunger is in the second position.

* * * * *

UNITED STATES PATENT AND TRADEMARK OFFICE
CERTIFICATE OF CORRECTION

PATENT NO.    : 6,472,624 B1
DATED         : October 29, 2002
INVENTOR(S)   : Jamie Harris, Gary Brown and Joel Fisher It is certified that error appears in the above-identified patent and that said Letters Patent is hereby corrected as shown below:

<u>Title page,</u>
Item [57], ABSTRACT,
Line 5, after the word "includes" insert -- a cartridge having --

<u>Column 2,</u>
Line 41, delete the word "bly" and insert -- cartridge assembly --

<u>Column 3,</u>
Line 39, delete the word "rough" and insert -- port 17 through --
Line 42, after "15", insert -- and has a --
Line 43, delete the word "amber" and insert -- the flow chamber --

Signed and Sealed this

Eighth Day of April, 2003

JAMES E. ROGAN
*Director of the United States Patent and Trademark Office*